(12) United States Patent
Miyagawa

(10) Patent No.: US 7,451,430 B2
(45) Date of Patent: Nov. 11, 2008

(54) APPARATUS AND METHOD FOR GENERATING TRANSISTOR MODEL

(75) Inventor: Seiji Miyagawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 322 days.

(21) Appl. No.: 11/478,581

(22) Filed: Jul. 3, 2006

(65) Prior Publication Data

US 2007/0001221 A1 Jan. 4, 2007

(30) Foreign Application Priority Data

Jul. 4, 2005 (JP) .............................. 2005-195485

(51) Int. Cl.
*G06F 17/50* (2006.01)
(52) U.S. Cl. .................. 716/19; 716/1; 716/7; 716/11; 716/12; 703/14
(58) Field of Classification Search ...................... 716/1, 716/2, 7, 11, 12, 19; 703/14; 250/310
See application file for complete search history.

(56) References Cited

U.S. PATENT DOCUMENTS 7,049,589 B2 * 5/2006 Yamaguchi et al. ......... 250/310

FOREIGN PATENT DOCUMENTS

| JP | 10-162047 A | 6/1998 |
|---|---|---|
| JP | 2004-119608 A | 4/2004 |

* cited by examiner

*Primary Examiner*—Thuan Do
(74) *Attorney, Agent, or Firm*—Sughrue Mion, PLLC

(57) ABSTRACT

In a transistor model generating apparatus, a transistor region extracting section extracts a non-rectangular transistor region, in which a gate region is formed above a non-rectangular diffusion layer region, from a mask layout data of a semiconductor integrated circuit. A dividing section sets a division line extending in a direction of a gate length of a transistor to divide the non-rectangular transistor region into a plurality of rectangular transistor regions. A relating section relates the non-rectangular transistor region and the plurality of rectangular transistor regions with the mask layout data. A size calculating section calculates a size data of each of the plurality of rectangular transistor regions. A correction value calculating section calculates a correction value of a diffusion layer length dependency parameter to the plurality of rectangular transistor regions based on the size data. A transistor model registering section registers a transistor model of the transistor for a circuit simulation based on the diffusion layer length dependency parameter and the correction value.

19 Claims, 7 Drawing Sheets

APPARATUS AND METHOD FOR GENERATING TRANSISTOR MODEL

BACKGROUND OF THE INVENTION

1. Field of the Invention

The present invention relates to a circuit simulation technique, and more particularly relates to an apparatus and method for generating a transistor model which is used in a circuit simulation.

2. Description of the Related Art

In recent years, through the development of a semiconductor technique, miniaturization of a semiconductor device has been advanced. Together with this, further improvement of precision of circuit simulation is required. In order to improve the simulation precision, it is necessary to improve a modeling precision of a circuit. For this purpose, circuit information indicating a state of an actual circuit must be modeled at a high precision.

Japanese Laid Open Patent Publication (JP-A-Heisei 10-162047) discloses a technique for extracting circuit information. A conventional circuit information extracting apparatus extracts the circuit information from a mask layout in which a final shape after a semiconductor circuit is manufactured is taken into account. The circuit information is used in a circuit simulation. The extracting apparatus determines an equivalent transistor size based on a transistor shape recognized from the mask layout so that gate capacities are coincident between a device in the circuit simulation and an actual device. In addition, the extracting apparatus virtually generates a compensation current source having a current value corresponding to a difference of a drain current between the device in the circuit simulation using this equivalent transistor size and the actual device. This equivalent transistor size and the compensation current source are used in the circuit simulation as the circuit information. This technique extracts the circuit information based on a gate shape. However, this technique does not consider the influence of the shape of a diffusion layer on the circuit information, which has been pointed out in recent years.

Also, a technique for generating a model of a MOS transistor is disclosed in Japanese Laid Open Patent Publication (JP-P 2004-119608A). A conventional circuit simulation apparatus has a unit for executing simulation and a unit for correcting a diffusion layer dependency parameter. The simulation executing unit reads a net list which indicates connection states in a simulation target circuit, refers to a transistor model and then calculates the changes in current and voltage of the simulation target circuit. The parameter correcting unit firstly generates a correction equation to diffusion layer length dependency parameter whose value is changed depending on a diffusion layer length, for a transistor model generated for a transistor having a predetermined diffusion layer length. The parameter correcting unit uses the correction equation to calculate the correction value of the diffusion layer length dependency parameter for the transistor model which is different in diffusion layer length from the already existing transistor model. Thus, a transistor model of a MOS transistor having a different diffusion layer length DL is generated. Consequently, the circuit simulation in which the diffusion layer length dependency of the drain current of the MOS transistor is taken into account becomes possible, thereby allowing the simulation in a high precision. This technique has an assumption that the shape of the diffusion layer is rectangular. Thus, when the shape of the diffusion layer is not rectangular, an error is caused.

FIG. 1 shows an example of a mask layout pattern of a transistor region with a rectangular diffusion layer. In FIG. 1, transistors having a gate width W and a gate length L are integrated. One transistor is formed in a region where a polysilicon layer 12 and a diffusion layer 10 are present, and another transistor is formed in a region where a polysilicon later 13 and the diffusion layer 10 are present. When the diffusion layer length is DL, the size of the diffusion layer 10 is represented by W and DL. In the foregoing rectangular diffusion layer, the correction value for the diffusion layer length dependency parameter can be calculated as mentioned above. A peripheral length of the diffusion layer 10 is equal to two times of a summation of the diffusion layer length DL and the gate width W. Therefore, the diffusion layer length DL is calculated as follows.

$DL = $ (Peripheral Length of Diffusion Layer 10)$/2 - W$

A diffusion layer shown in FIG. 2 is not rectangular. Such a non-rectangular diffusion layer pattern is used when a set of an inverter circuit and a NAND circuit, a set of an inverter circuit and a NOR circuit, or a set of an inverter circuit and a transfer gate is integrated on the diffusion layer. That is, non-rectangular diffusion layer is generated when transistors requiring different diffusion layer dimensions are integrated. In FIG. 2, a diffusion layer 11a which is used to form transistors together with the polysilicon layer 12 and a diffusion layer 11b which is used to form transistors together with the polysilicon layer 13 are unified to form the non-rectangular diffusion layer 11. Although this diffusion layer 11 is different in shape from the diffusion layer 10 shown in FIG. 1, the peripheral length of the diffusion layer 11 is same as that of the diffusion layer 10. Therefore, a diffusion layer length DL' is calculated as follows from the peripheral length of the diffusion layer 11:

$DL' = $ (Peripheral Length of Diffusion Layer 11)$/2 - W'$

Here, W' indicates the gate width of the transistors having the polysilicon layer 13 as the gate. Thus, the calculated diffusion layer length DL' is longer by $\Delta DL$ than an actual diffusion layer length DL. If a correction value of the diffusion layer length dependency parameter for the transistor model is calculated based on the diffusion layer length DL', an error is naturally introduced, and the simulation precision is reduced. Such an error had little influence on the simulation, and could be ignored. However, as the miniaturization is advanced, it becomes impossible to ignore the error in order to further improve the simulation precision.

In this way, the diffusion layer length DL has been calculated by using the peripheral diffusion layer length even in a case of the non-rectangular diffusion layer in addition to a case of the rectangular diffusion layer. As a result, the error was introduced into the actual diffusion layer length DL, so that the simulation precision was not improved for the transistor region with the non-rectangular diffusion layer.

SUMMARY OF THE INVENTION

In an aspect of the present invention, in a transistor model generating apparatus, a transistor region extracting section extracts a non-rectangular transistor region, in which a gate region is formed above a non-rectangular diffusion layer region, from a mask layout data of a semiconductor integrated circuit. A dividing section sets a division line extending in a direction of a gate length of a transistor to divide the non-rectangular transistor region into a plurality of rectangular transistor regions. A relating section relates the non-rectangular transistor region and the plurality of rectangular transistor regions with the mask layout data. A size calculating section calculates a size data of each of the plurality of rectangular transistor regions. A correction value calculating section calculates a correction value of a diffusion layer length dependency parameter to the plurality of rectangular transistor regions based on the size data. A transistor model registering section registers a transistor model of the transistor for a circuit simulation based on the diffusion layer length dependency parameter and the correction value.

Here, the extracting section may determine that the transistor region is non-rectangular, based on apexes of the transistor region.

Also, a direction of the division line may be determined based on positions of apexes of the gate region, one end of the division line may be determined as one associated with a concave section, of apexes on the non-rectangular transistor region, and the other end of the division line may be determined as an intersection of the division line and a frame of the non-rectangular transistor region when the division line is drawn from the one end in the determined direction.

Also, the dividing section may allocate the non-rectangular transistor region to a first recognition layer, and may allocate each of the plurality of rectangular transistor regions to a second recognition layer.

In this case, the dividing section may allocate the first and second recognition layers to different unused process layers.

Also, the second recognition layer may have a plurality of process layers, and the plurality of rectangular transistor regions may be allocated to the plurality of process layers, respectively.

Also, the transistor model may have a first identifier indicating a number of the plurality of rectangular transistor regions. In this case, the transistor model registering section may give a second identifier to the first identifier to indicate a generation order.

Also, the diffusion layer length dependency parameter may have a mobility parameter and a threshold voltage parameter. The correction value calculating section may calculate mobility parameter fmu(DL) from the following equation (1), when a diffusion layer length of an n-th region of the plurality of rectangular transistor regions is DLn and a gate width thereof is Wn, and may calculate the threshold voltage parameter fvth(DL) from the following equation (2), $$fmu(DL)=fmu(DL=DL1)*W1/(W1+W2+\ldots+Wn)+ \\ fmu(DL=DL2)*W2/(W1+W2+\ldots+Wn)+\ldots+ \\ fmu(DL=DLn)*Wn/(W1+W2+\ldots+Wn) \quad (1)$$

$$fvth(DL)=fvth(DL=DL1)*W1/(W1+W2+\ldots+d\,Wn)+ \\ fvth(DL=DL2)*W2/(W1+W2+\ldots+Wn)+\ldots+ \\ fvth(DL=DLn)*Wn/(W1+W2+\ldots+Wn)$$

Also, in another aspect of the present invention, a method of generating a transistor model is achieved by extracting a non-rectangular transistor region, in which a gate region is formed above a non-rectangular diffusion layer region, from a mask layout data of a semiconductor integrated circuit; by dividing the non-rectangular transistor region into a plurality of rectangular transistor regions by a division line extending in a direction of a gate length of a transistor; by relating the non-rectangular transistor region and the plurality of rectangular transistor regions with the mask layout data; by calculating a size data of each of the plurality of rectangular transistor regions; by calculating a correction value of a diffusion layer length dependency parameter to the plurality of rectangular transistor regions based on the size data; and by registering a transistor model of the transistor for a circuit simulation based on the diffusion layer length dependency parameter and the correction value.

Also, the extracting may be achieved by determining that the transistor region is non-rectangular, based on apexes of the transistor region.

Also, the dividing may be achieved by determining a direction of the division line based on positions of apexes of the gate region; by determining one end of the division line as one associated with a concave section, of apexes on the non-rectangular transistor region; and by drawing the division line from the one end to the other end of the division line as an intersection of the division line and a frame of the non-rectangular transistor region in the determined direction.

Also, the dividing may be achieved by allocating the non-rectangular transistor region to a first recognition layer; and by allocating each of the plurality of rectangular transistor regions to a second recognition layer.

Also, the dividing may be achieved by allocating the first and second recognition layers to different unused process layers.

Also, the second recognition layer may have a plurality of process layers, and the dividing may be achieved by allocating the plurality of rectangular transistor regions to the plurality of process layers, respectively.

Also, the registering may be achieved by allocating a first identifier to the transistor model to indicate a number of the plurality of rectangular transistor regions.

Also, the registering may be achieved by giving a second identifier to the first identifier to indicate a generation order.

Also, the diffusion layer length dependency parameter has a mobility parameter and a threshold voltage parameter, and the calculating a correction value may be achieved by calculating the correction value calculating section mobility parameter fmu(DL) from the following equation (1), when a diffusion layer length of an n-th region of the plurality of rectangular transistor regions is DLn and a gate width thereof is Wn, $$fmu(DL)=fmu(DL=DL1)*W1/(W1+W2+\ldots+Wn)+ \\ fmu(DL=DL2)*W2/(W1+W2+\ldots+Wn)+\ldots+ \\ fmu(DL=DLn)*Wn/(W1+W2+\ldots+Wn) \quad (1), \text{ and by}$$

calculating the threshold voltage parameter fvth(DL) from the following equation (2), $$fvth(DL)=fvth(DL=DL1)*W1/(W1+W2+\ldots+Wn)+ \\ fvth(DL=DL2)*W2/(W1+W2+\ldots+Wn)+\ldots+ \\ fvth(DL=DLn)*Wn/(W1+W2+\ldots+Wn) \quad (2).$$

In a still another aspect of the present invention, a computer-readable software product for realizing a method of generating a transistor model, wherein the method is achieved by extracting a non-rectangular transistor region, in which a gate region is formed above a non-rectangular diffusion layer region, from a mask layout data of a semiconductor integrated circuit; by dividing the non-rectangular transistor region into a plurality of rectangular transistor regions by a division line extending in a direction of a gate length of a transistor; by relating the non-rectangular transistor region and the plurality of rectangular transistor regions with the mask layout data; by calculating a size data of each of the plurality of rectangular transistor regions; by calculating a correction value of a diffusion layer length dependency parameter to the plurality of rectangular transistor regions based on the size data; and by registering a transistor model of the transistor for a circuit simulation based on the diffusion layer length dependency parameter and the correction value.

DESCRIPTION OF THE PREFERRED EMBODIMENTS

Figure 7:
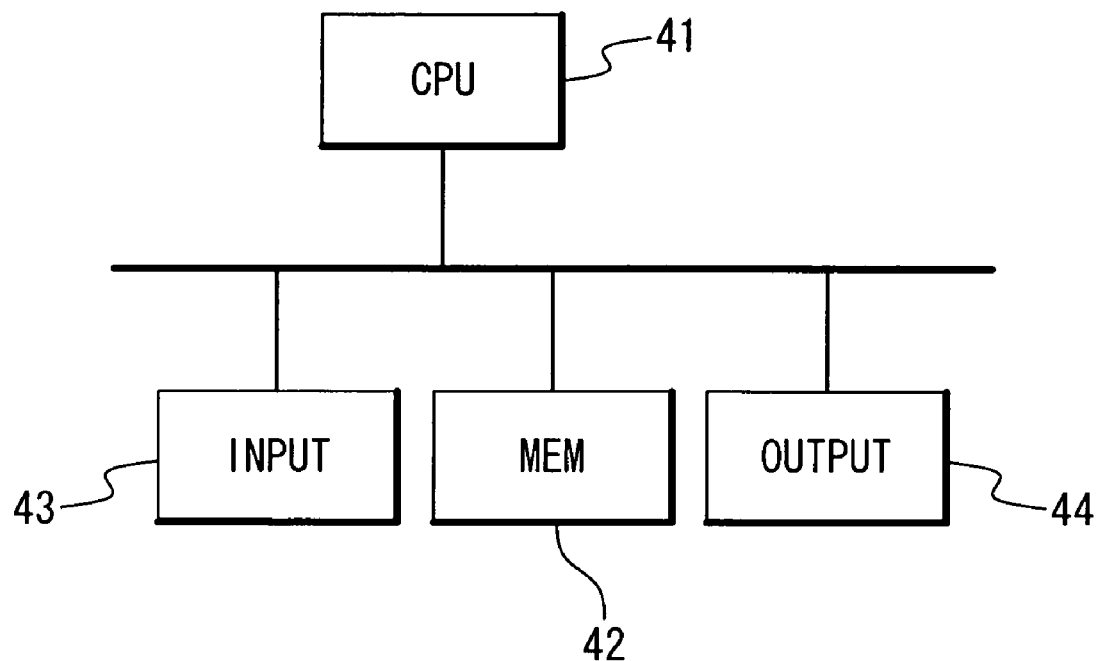
FIG. 7 is a block diagram showing a configuration of a transistor model generating apparatus according to the embodiment of the present invention.

Hereinafter, a transistor model generating apparatus of the present invention will be described in detail with reference to the attached drawings. The transistor model generating apparatus generates a transistor model used in a circuit simulation, from a mask layout data. The transistor model generating apparatus is an information processing apparatus such as a workstation and a personal computer, and has a configuration shown in FIG. 7. The entity of the functions to be achieved is provided as software to be executed on the information processing apparatus. The transistor model generating apparatus includes a central processing unit (CPU) 41, a storing unit (MEM) 42, an input unit 43 and an output unit 44. The storing unit 42 receives and stores a process program, a mask layout data, a net list and the like from the input unit 43 in advance. The CPU 41 executes the process program stored in the storing unit 42 and generates the transistor model used in the circuit simulation, from the mask layout data stored in the storing unit 42. The generated transistor model is outputted from the output unit 44. Also, a data indicating a name of the generated transistor model and the middle result of the generation are outputted from the output unit 44.

Figure 1:
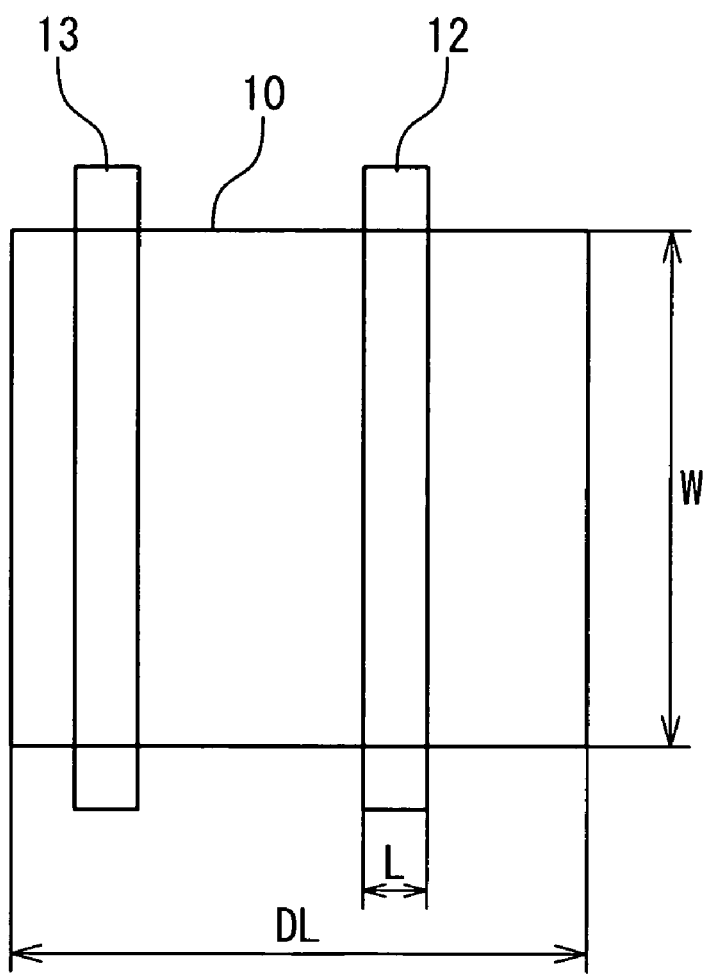
FIG. 1 is a diagram showing a conventional layout example of a transistor region with a rectangular diffusion layer.
Figure 2:
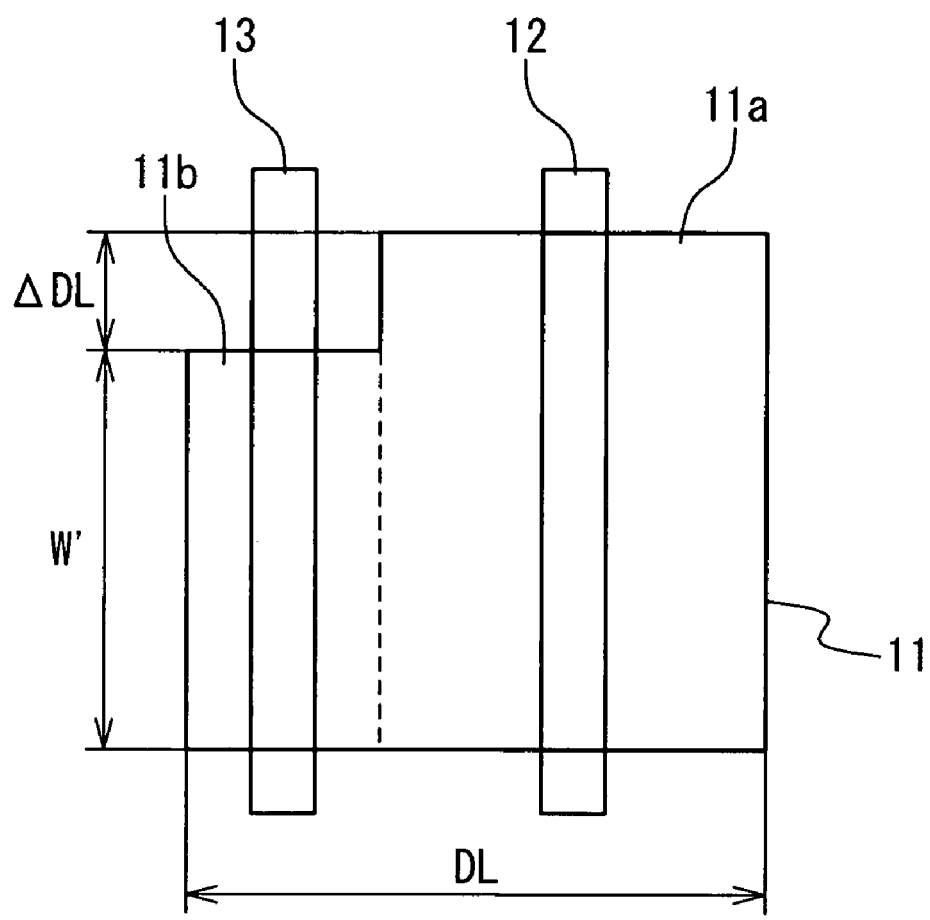
FIG. 2 is a diagram showing a layout example of a transistor region with a non-rectangular diffusion layer.
Figure 3:
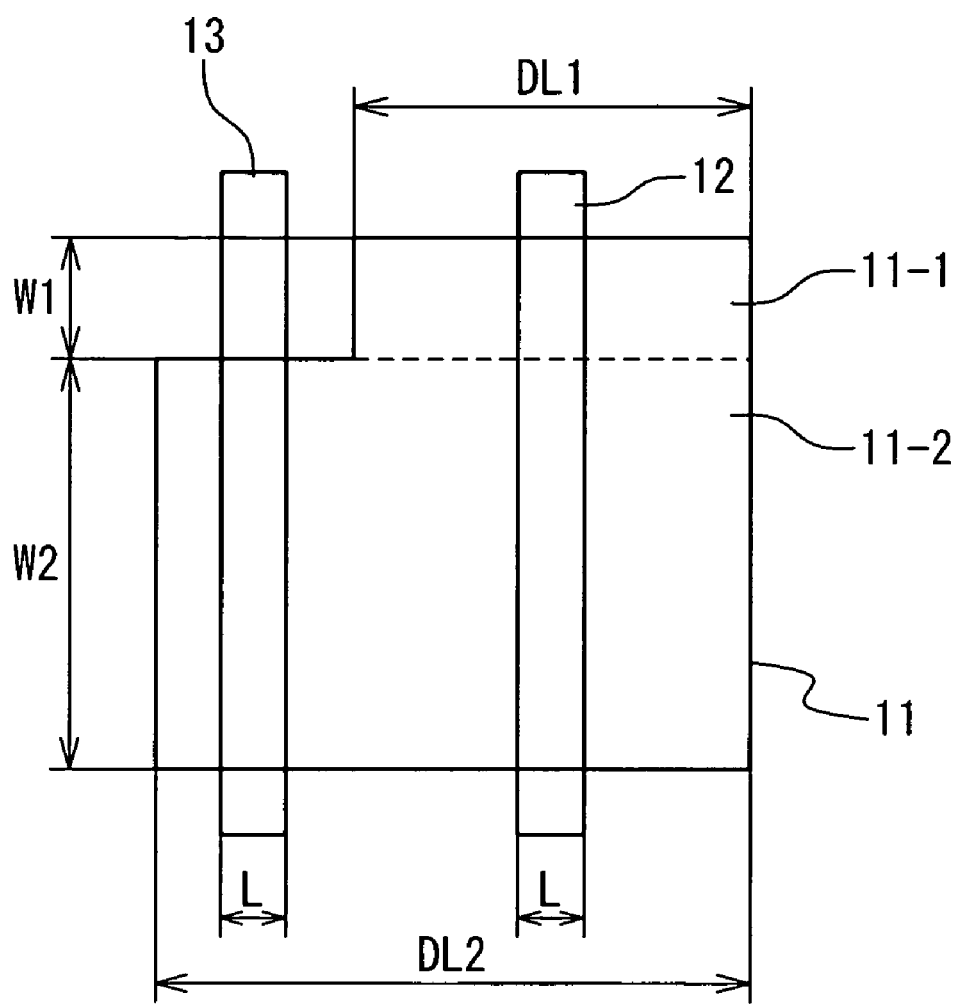
FIG. 3 is a diagram showing division of the non-rectangular diffusion layer in an embodiment of the present invention.

FIG. 3 shows an example of a mask layout pattern for transistors having a non-rectangular transistor region. The transistor model generating apparatus produces a model of the transistors formed in a non-rectangular diffusion layer as shown in FIG. 3. Such a mask layout pattern is generated, when a set of an inverter circuit and a NAND circuit, a set of an inverter circuit and a NOR circuit, and a set of an inverter circuit and a transfer gate are integrated in the non-rectangular diffusion layer. Here, two transistors, namely, a transistor using a polysilicon layer 12 and the diffusion layer 11 and a transistor using a polysilicon layer 13 and the diffusion layer 11 are formed. A gate length of the transistors formed by using the polysilicon layers 12 and 13 is assumed to be L, and a maximum gate width W is assumed to be W=W1+W2.

When the diffusion layer 11 is divided into a diffusion layer 11-1 and a diffusion layer 11-2 by a division line extending in a gate length direction, the rectangular diffusion layers 11-1 and 11-2 are generated. That is, the diffusion layer 11-1 can be treated as a diffusion layer having the size of a gate width W1 and a diffusion layer length DL1. The diffusion layer 11-2 can be treated as the diffusion layer having the size of a gate width W2 and a diffusion layer length DL2. In this embodiment, the non-rectangular diffusion layer 11 is divided into the rectangular diffusion layers 11-1 and 11-2, and a correction value for the diffusion layer length dependency parameter for the division resultant rectangular diffusion layers is determined. Thus, the transistor model for the non-rectangular diffusion layer is generated.

Figure 4:
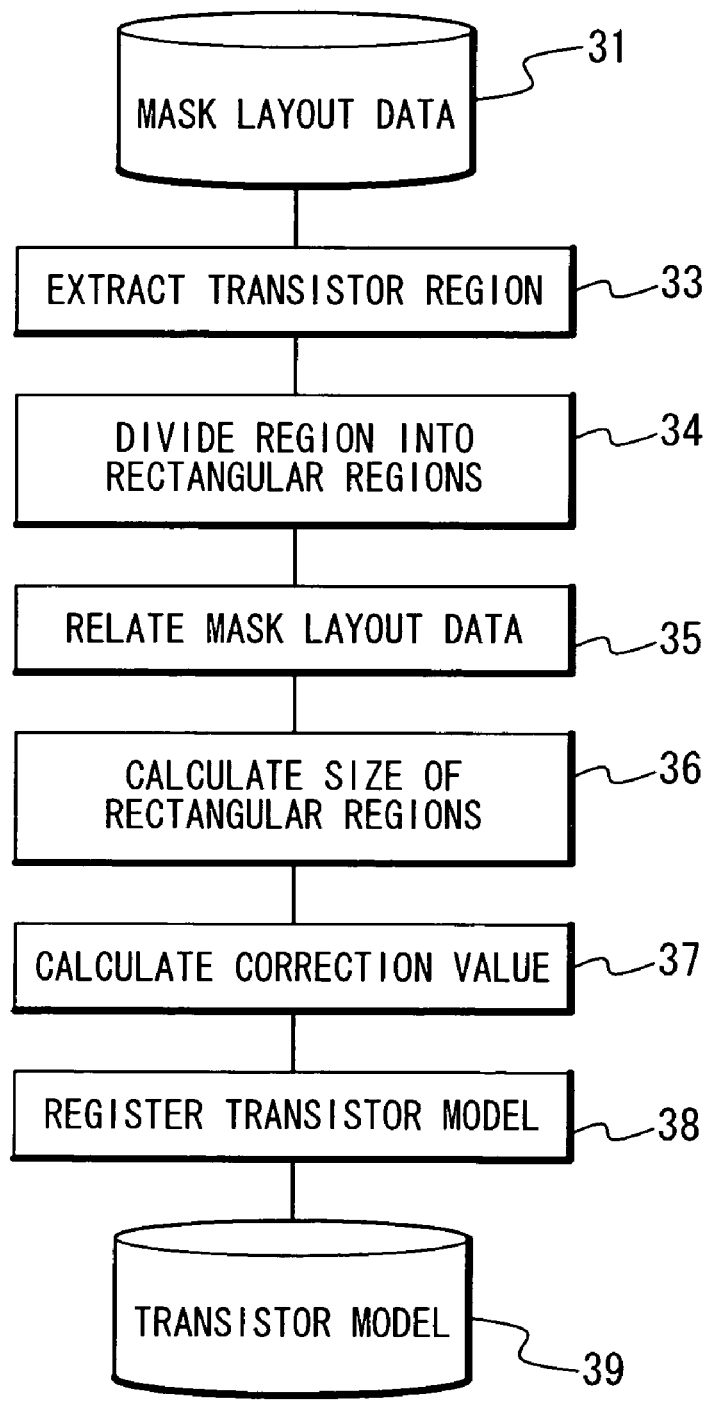
FIG. 4 is a flow chart showing a process procedure of modeling of the transistor region having the non-rectangular diffusion layer in the embodiment of the present invention.

The process procedure for the model generation for the non-rectangular diffusion layer will be described below with reference to FIG. 4. The process procedure for generating the transistor model includes processes to be sequentially executed such as a transistor extracting process 33, a rectangle dividing process 34, a mask layout relating process 35, a rectangular region size calculating process 36, a correction value calculating process 37 and a transistor model registering process 38.

Figure 5A:
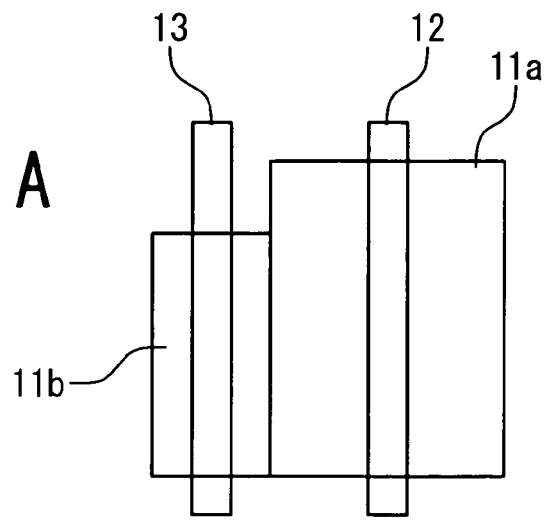
FIGS. 5A to 5D are diagrams showing processes in the embodiment of the present invention.
Figure 5B:
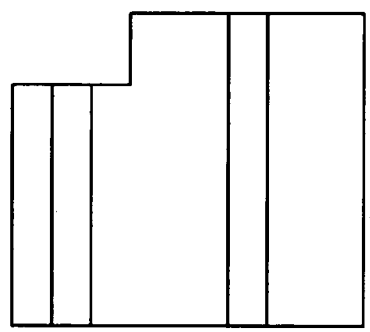

The transistor extracting process 33 and the rectangular region dividing process 34 will be described below with reference to FIGS. 5A to 5D. In the transistor extracting process 33, as described below, a region where the transistors are formed is extracted from a mask layout data 31. A graphic logic process (AND calculating process) is executed to a process layer to which a pattern of a polysilicon layer for a gate region of the transistor is assigned, and a process layer to which a pattern of the diffusion layer is assigned, to extract a region where the transistors are formed. Thus, the transistors regions are extracted as the data of the plurality of layers, such as the diffusion layers 11a and 11b, and the polysilicon layers 12 and 13, as shown in FIG. 5A. The transistor region receives the data indicating the transistors before the transistors are integrated, and the transistor region is represented as a set of the diffusion layers 11a and 11b corresponding to the two transistors. Since the data of the polysilicon layers 12 and 13 and the diffusion layers 11a and 11b are separately managed, image processing is carried out to attain the image to be projected to one process layer, as shown in FIG. 5B. Through the image processing, a non-rectangular pattern can be easily grasped based on the number of apexes.

Figure 5C:
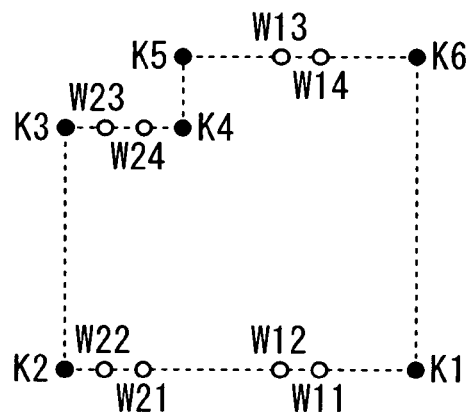
Figure 5D:
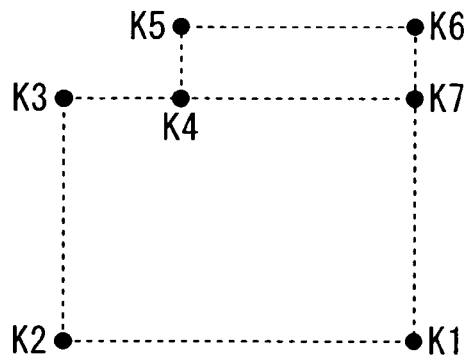

In the rectangle dividing process 34, the coordinates of the apexes of the respective regions are determined from the image of FIG. 5B. In FIG. 5C, the apexes of the diffusion layer region are represented by black circles, and the apexes of the gate regions are represented by white circles. The non-rectangular diffusion layer has apexes K1, K2, K3, K4, K5 and K6. Also, the gate regions for the two transistors have the set of apexes W11, W12, W13 and W14 and the set of apexes W21, W22, W23 and W24. The orientation of the transistor is determined from the array and interval between the apexes of this gate region. For example, as for the array of the apexes W13 to W14 and the apexes W13 to W12, the former is known to be narrower in interval between the apexes, and this direction is known to be the direction of the gate length. Thus, in case of FIGS. 5A to 5C, a division line is horizontally arranged, thereby dividing the region into rectangles. It is known that concaves exist in the apexes K3, K4 and K5, from the maximum and minimum values in the coordinates of the apexes of the non-rectangular regions. The position intersecting the side of the non-rectangular region vertical to extension lines are determined on the extension lines of the apexes K3 and K4 from these coordinates. That is, at the position at which the line passing through the apexes K3 and K4 and the line connecting the apexes K1 and the apex K6 intersect, the point K7 is given as an apex (FIG. 5D). Since this apex K7 is added, the non-rectangular region is divided into a rectangular region surrounded with the lines connecting the apexes K7, K4, K5 and K6, and a rectangular region surrounded with the line connecting the apexes K7, K1, K2 and K3. That is, as shown in FIG. 3, the non-rectangular diffusion layer region 11 is divided into the rectangular region 11-1 and the rectangular region 11-2.

In the mask layout relating process 35, this non-rectangular region 11 is related to the original layout data 31 as an image in a recognition layer 1, in order to indicate the non-rectangular region to be divided. Also, the rectangular regions 11-1 and 11-2 are related to the original layout data 31 as the image in a recognition layer 2, in order to indicate that they are regions that are made rectangular after the division of the non-rectangular region. In an actual process such as the image processing, non-used process layers (for example, 100 layers) are assigned to this recognition layer 1. The non-used layers of a same number as the number of the rectangular regions are assigned to the recognition layer 2. That is, for example, a non-used 101 layer and a non-used 102 layer are assigned to the recognition layer 2. In this way, in the rectangular region size calculating process 36, each of the images indicating the division resultant regions can be treated and calculated as an image of a different region. In addition, it is possible to output the process result as a parameter of the net list.

Figure 6:
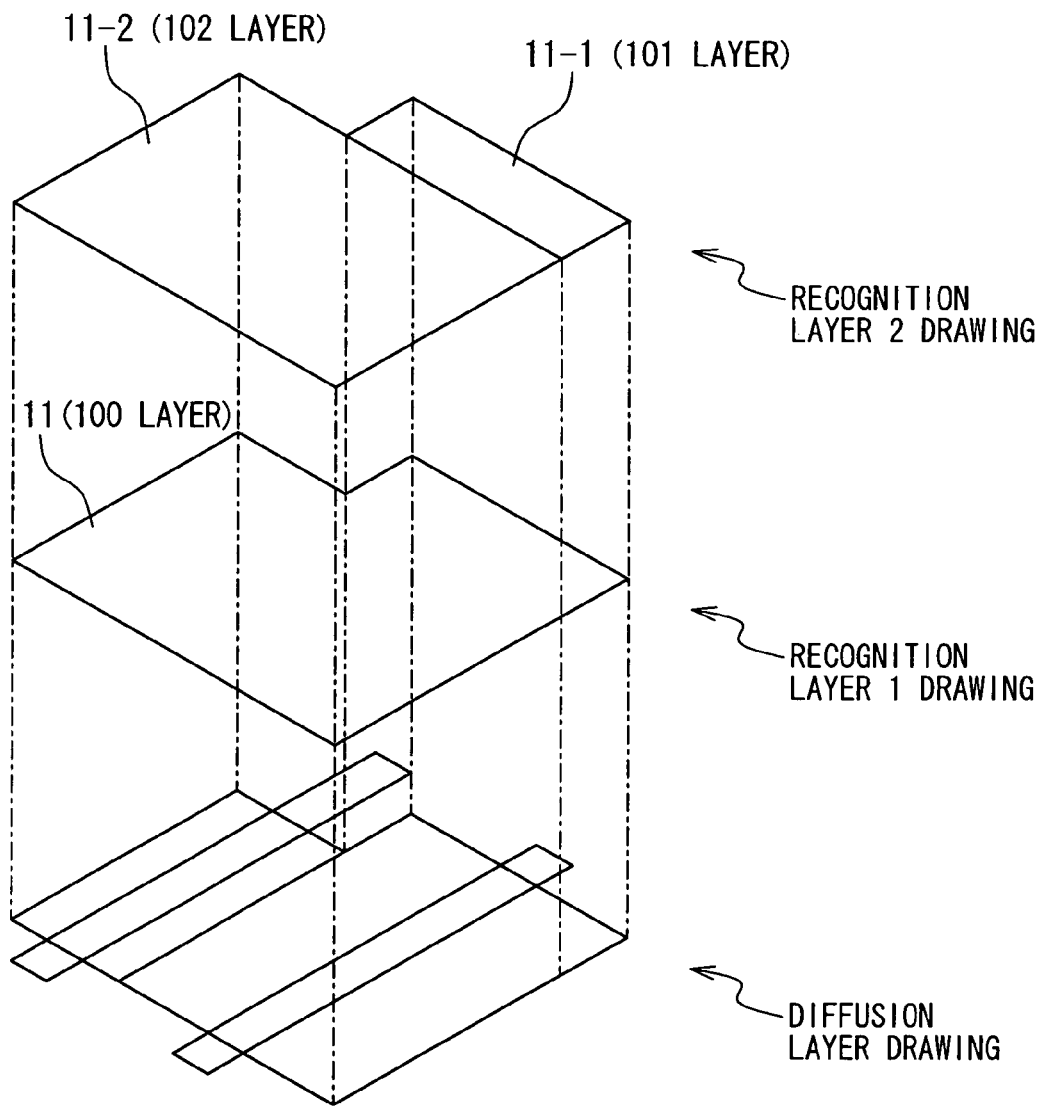
FIG. 6 is a diagram showing a recognition layer in the embodiment of the present invention.

A relation between these process layers is shown as shown in FIG. 6. That is, the image layer of the recognition layer 1 is assigned to the diffusion layer regions 11a and 11b having physical correspondence and the diffusion layer images indicating the polysilicon layers 12 and 13. The image indicating the non-rectangular transistor region 11 is set to the recognition layer 1. The 100 layer as the process layer is assigned to this recognition layer 1. Moreover, an image is set to the recognition layer 2 in correspondence to the recognition layer 1. Thus, the image indicating the recognition regions 11-1 and 11-2 is set to the recognition layer 2. The image indicating the diffusion layer 11-1 is assigned to the 101 layer as the process layer, and the image indicating the diffusion layer 11-2 is assigned to the 102 layer.

In the rectangular region size calculating process 36, the size of the image set to the recognition layer 2 is calculated. The process layers assigned to the recognition layer 2 are the 101 layer and the 102 layer in case of two-division. The size of the diffusion layer 11-1 is calculated from the image after the AND process between the 100 layer and the 101 layer. Similarly, the size of the divided diffusion layer 11-2 is calculated from the image after the AND process between the 100 layer and the 102 layer. The calculated sizes are outputted in correspondence to the image of the recognition layer 1. Thus, in this case, two sets of size data are outputted together with another parameter of the non-rectangular region.

This process may be carried out by software for generating a net list for simulation at a time of LVS (Layout Versus Schematic) verification. In such a case, its rule is set as follows. A target transistor is registered in the recognition layer 1, and is the transistor having the diffusion layer defined the recognition layer 2. Its transistor model name is indicated in accordance with the number of the process layers (referred to as m) used in the recognition layer 2, as described below.

Transistor Model Name: NENHHP_m (m≧2)

Moreover, a calculation equation is added to a parameter portion of each transistor model to output a value of a set of the diffusion layer length DL and the gate width W, as described below. Here, a diffusion layer length of the rectangular diffusion layer region to be registered in the n-th process layer is assumed to be DLn, and its gate width is assumed to be Wn (n does not exceed the number of the process layers in the recognition layers 2).

Wn=(Length Between Edges of Gate Region in Contact with Diffusion Layers Contained in Recognition Layer 2)/2

DLn=(Peripheral Length of Diffusion Layers contained in Recognition Layer 2)/2−Wn The LVS verification software generates and outputs the net list from the layout data in which the recognition layers 1 and 2 are related to each other, based on a thus defined rule file. In this net list, the diffusion layer length DLn and the gate width Wn for each of the rectangular division diffusion layers 11-1 and 11-2 are added as parameters together with the gate length L and the gate width W of the non-rectangular diffusion layer 11 prior to the division. An example of the net list outputted by the LVS verification software will be described below.

MN011 GND IN0 net1 GND nenhhp_2 $_{l=}$0.1 u w=0.48 u
  ad=0.0813069 p as=0.12 p
pd=0.813435 u ps=1.46 u $w1=0.48 u $dl1=0.98 u $w2=0.35
  u $dl2=0.6 u
MN012 net2 net1 GND GND nenhhp_2 l=0.1 u w=0.83 u
  ad=0.2075 p as=0.140593 p
pd=2.16 u ps=1.40656 u $w1=0.48 u $dl1=0.98 u $w2=0.35
  u $dl2=0.6 u Since this net list is configured similarly to a typical net list, its detailed explanation is omitted. However, the parameter to which "$" is given is a parameter that is additionally defined for this time. It could be understood that two transistors exist in the non-rectangular diffusion layer and element names of MN011, MN012 are given respectively. Since the non-rectangular diffusion layer region is divided into two, a model name of the transistor of the rectangular region is represented as "nenhhp_2". It could be understood that the gate width W1 and the diffusion layer length DL1 of the first rectangular region are outputted as "$w1=0.48 u" and "$dl1=0.98 u", and the gate width W2 and the diffusion layer length DL2 of the second rectangular division region are outputted as "$w2=0.35 u" and "$dl=0.60 u".

Until now, one non-rectangular transistor region has been described. However, there are many non-rectangular diffusion layers. Correction values of the transistors having the diffusion layer regions of different sizes are respectively different. In order to identify them, the transistor model name is required to be changed. For example, it is supposed that the net list of the transistor having the non-rectangular region which is divided into two of the different sizes is outputted as shown below:

MN013 GND net2 net3 GND nenhhp_2 l=0.1 u w=0.9 u
  ad=0.134664 p as=0.225 p
pd=1.2785 u ps=2.3 u $w1=0.9 u $dl1=0.98 u $w2=0.34 u
  $dl2=0.53 u
MN014 net4 net3 GND GND nenhhp_2 l=0.1 u w=1.24 u
  ad=0.31 p as=0.185536 p
pd=2.98 u ps=1.7615 u $w1=0.9 u $dl1=0.98 u $w2=0.34 u
  $dl 2=0.53 u The gate width W1 of the first rectangular region is different, and is "$w1=0.48 u" in the former net list and is "$w1=0.9 u" in the later net list. Thus, in order to identify them, the transistor model name is changed. The new transistor model name is assumed that an original identification number indicating an order is added to the original transistor model name. Here, the new transistor model names to the transistors MN011 and MN012 indicated in the former net list are NENHHP_2_1. The new transistor model names to the transistors MN013 and MN014 indicated in the latter net list are NENHHP_2_2. This converting process may be carried out in script. The net list in which the respective transistor models in the two net lists are converted into different names and integrated into one is indicated below:

MN011 GND IN0 net1 GND nenhhp_2_1 l=0.1 u w=0.48 u ad=0.0813069 p as=0.12 p pd=0.813435 u ps=1.46 u $w1=0.48 u $dl1=0.98 u $w2=0.35 u $dl 2=0.6 u MN012 net2 net1 GND GND nenhhp_2_1 l=0.1 u w=0.83 u ad=0.2075 p as=0.140593 p pd=2.16 u ps=1.40656 u $w1=0.48 u $dl1=0.98 u $w2=0.35 u $dl2=0.6 u MN013 GND net2 net3 GND nenhhp_2_2 l=0.1 u w=0.9 u ad=0.134664 p as=0.225 p pd=1.2785 u ps=2.3 u $w1=0.9 u $dl1=0.98 u $w2=0.34 u $dl 2=0.53 u MN014 net4 net3 GND GND nenhhp_2_2 l=0.1 u w=1.24 u ad=0.31 p as=0.185536 p pd=2.98 u ps=1.7615 u $w1=0.9 u $dl1=0.98 u $w2=0.34 u $dl2=0.53 u In the correction value calculating process 37, a correction value for the diffusion layer length dependency parameter of the transistor model is calculated based on the output of the net list. A set of the diffusion layer length DLn and the gate width Wn, which is outputted for each transistor model, is substituted into a predetermined equation. Then, the correction value for the diffusion layer length dependency parameter for the transistor model, namely, the new diffusion layer length dependency parameter is determined. Here, the diffusion layer length dependency parameter is assumed to be a movement degree parameter fmu(DL) and a threshold voltage parameter fvth(DL), and each of them is calculated from next equations. This calculation equation indicates a case of division of a region into n regions. The parameter fmu(DL=DL1) indicates a movement degree parameter value in the rectangular region having the diffusion layer length DL1, and the parameter fvth(DL=DL1) indicates a threshold voltage parameter value in the rectangular region having the diffusion layer length DL1.

$$fmu(DL)=fmu(DL=DL1)*W1/(W1+W2+\ldots+Wn)+ fmu(DL=DL2)*W2/(W1+w2+\ldots+Wn)+\ldots$$

$$+fmu(DL=DLn)*Wn/(W1+W2+\ldots+Wn)$$

$$fvth(DL)=fvth(DL=DL1)*W1+W230\ldots+Wn)+fvth(DL=DL2)*W2/(W1+W2+\ldots$$

In the transistor model registering process 38, a transistor model 39 used in the circuit simulation is registered in correspondence to the transistor model name generated as mentioned above and the diffusion layer length dependency parameter of each transistor model calculated by the correction value calculating process 37. In the net list with regard to the above four transistors, the two transistor models are extracted and new two transistor models for the circuit simulation of NENHHP_2_1 and NENHHP_2_2 are registered. The circuit simulation of the higher precision is carried out based on those updated transistor model groups and the extracted simulation net list.

As the software for the circuit simulation, for example, SPICE (Simulation Program with Integrated Circuit Emphasis) is used. By supplying the above net list to this SPICE and using the parameters of a transistor model groups including NENHHP_2_1 and NENHHP_2_2 as the transistor models, it becomes possible to carry out the circuit simulation of the higher precision for a circuit that contains the transistors having the non-rectangular diffusion layer region. This circuit simulation software may be executed in the same apparatus as the transistor model generating apparatus as mentioned above. Also, the circuit simulation software may be executed by supplying the transistor model having the non-rectangular diffusion layer region generated by the transistor model generating apparatus and the net list to a circuit simulation apparatus different from the transistor model generating apparatus. Moreover, a program for generating the transistor model of the transistor having the non-rectangular diffusion layer region may be assembled into the circuit simulation software.

In this embodiment, the example has been described in which the non-rectangular diffusion layer region is divided into two. However, in case of the division of the region into three or more, the correction value can be similarly calculated. Also, a plurality of transistors having the non-rectangular diffusion layer regions can be extracted at the same time. The division of the non-rectangular diffusion layer, the relation to the layout data, the output of the net list involving the size calculation, the correction value calculation for each transistor model, and the registration of the transistor model can be naturally executed at a same time over the plurality of non-rectangular diffusion layer regions.

In this way, the diffusion layer length dependency parameter serving as the correction value for the diffusion layer length DL of the transistor having the non-rectangular diffusion layer region can be easily calculated in a higher precision, and the circuit simulation of the higher precision can be carried out by using the transistor model in which this correction value is reflected.

What is claimed is:

1. A transistor model generating apparatus comprising:
   a transistor region extracting section configured to extract a non-rectangular transistor region, in which a gate region is formed above a non-rectangular diffusion layer region, from a mask layout data of a semiconductor integrated circuit;
   a dividing section configured to set a division line extending in a direction of a gate length of a transistor to divide said non-rectangular transistor region into a plurality of rectangular transistor regions;
   a relating section configured to relate said non-rectangular transistor region and said plurality of rectangular transistor regions with said mask layout data;
   a size calculating section configured to calculate a size data of each of said plurality of rectangular transistor regions;
   a correction value calculating section configured to calculate a correction value of a diffusion layer length dependency parameter to said plurality of rectangular transistor regions based on said size data; and
   a transistor model registering section configured to register a transistor model of said transistor for a circuit simulation based on said diffusion layer length dependency parameter and said correction value.

2. The transistor model generating apparatus according to claim 1, wherein said extracting section determines that said transistor region is non-rectangular, based on apexes of said transistor region.

3. The transistor model generating apparatus according to claim 1, wherein a direction of said division line is determined based on positions of apexes of said gate region,
   one end of said division line is determined as one associated with a concave section, of apexes on said non-rectangular transistor region, and
   the other end of said division line is determined as an intersection of said division line and a frame of said non-rectangular transistor region when said division line is drawn from the one end in the determined direction.

4. The transistor model generating apparatus according to claim 1, wherein said dividing section allocates said non-rectangular transistor region to a first recognition layer, and allocates each of said plurality of rectangular transistor regions to a second recognition layer.

5. The transistor model generating apparatus according to claim 4, wherein said dividing section allocates said first and second recognition layers to different unused process layers.

6. The transistor model generating apparatus according to claim 4, wherein said second recognition layer has a plurality of process layers, and
said plurality of rectangular transistor regions are allocated to said plurality of process layers, respectively.

7. The transistor model generating apparatus according to claim 4, wherein said transistor model has a first identifier indicating a number of said plurality of rectangular transistor regions.

8. The transistor model generating apparatus according to claim 7, wherein said transistor model registering section gives a second identifier to said first identifier to indicate a generation order.

9. The transistor model generating apparatus according to claim 1, wherein said diffusion layer length dependency parameter has a mobility parameter and a threshold voltage parameter, and
said correction value calculating section calculates mobility parameter fmu(DL) from the following equation (1), when a diffusion layer length of an n-th region of said plurality of rectangular transistor regions is DLn and a gate width thereof is Wn, and calculates the threshold voltage parameter fvth(DL) from the following equation (2), $$fmu(DL)=fmu(DL=DL1)*W1/(W1+W2+\ldots+Wn)+ \\ fmu(DL=DL2)*W2/(W1+W2+\ldots+Wn)+\ldots+ \\ fmu(DL=DLn)*Wn/(W1+W2+\ldots+Wn) \quad (1)$$

$$fvth(DL)=fvth(DL=DL1)*W1/(W1+W2+\ldots+Wn)+ \\ fvth(DL=DL2)*W2/(W1+W2+\ldots+Wn)+\ldots+ \\ fvth(DL=DLn)*Wn/(W1+W2+\ldots+Wn).$$

10. A method of generating a transistor model, comprising:
extracting a non-rectangular transistor region, in which a gate region is formed above a non-rectangular diffusion layer region, from a mask layout data of a semiconductor integrated circuit;
dividing said non-rectangular transistor region into a plurality of rectangular transistor regions by a division line extending in a direction of a gate length of a transistor;
relating said non-rectangular transistor region and said plurality of rectangular transistor regions with said mask layout data;
calculating a size data of each of said plurality of rectangular transistor regions;
calculating a correction value of a diffusion layer length dependency parameter to said plurality of rectangular transistor regions based on said size data; and
registering a transistor model of said transistor for a circuit simulation based on said diffusion layer length dependency parameter and said correction value.

11. The method according to claim 10, wherein said extracting comprises:
determining that said transistor region is non-rectangular, based on apexes of said transistor region.

12. The method according to claim 10, wherein said dividing comprises:
determining a direction of said division line based on positions of apexes of said gate region;
determining one end of said division line as one associated with a concave section, of apexes on said non-rectangular transistor region; and
drawing said division line from said one end to the other end of said division line as an intersection of said division line and a frame of said non-rectangular transistor region in the determined direction.

13. The method according to claim 10, wherein said dividing comprises:
allocating said non-rectangular transistor region to a first recognition layer; and
allocating each of said plurality of rectangular transistor regions to a second recognition layer.

14. The method according to claim 13, wherein said dividing comprises:
allocating said first and second recognition layers to different unused process layers.

15. The method according to claim 13, wherein said second recognition layer has a plurality of process layers, and
said dividing comprises:
allocating said plurality of rectangular transistor regions to said plurality of process layers, respectively.

16. The method according to claim 13, wherein said registering comprises:
allocating a first identifier to said transistor model to indicate a number of said plurality of rectangular transistor regions.

17. The method according to claim 16, wherein said registering comprises:
giving a second identifier to said first identifier to indicate a generation order.

18. The method according to claim 10, wherein said diffusion layer length dependency parameter has a mobility parameter and a threshold voltage parameter, and
said calculating a correction value comprises:
calculating said correction value calculating section mobility parameter fmu(DL) from the following equation (1), when a diffusion layer length of an n-th region of said plurality of rectangular transistor regions is DLn and a gate width thereof is Wn, $$fmu(DL)=fmu(DL=DL1)*W1/(W1+W2+\ldots+Wn)+ \\ fmu(DL=DL2)*W2/(W1+W2+\ldots+Wn)+\ldots+ \\ fmu(DL=DLn)*Wn/(W1+W2+\ldots+Wn) \quad (1), \text{ and}$$

calculating the threshold voltage parameter fvth(DL) from the following equation (2), $$fvth(DL)=fvth(DL=DL1)*W1/(W1+W2+\ldots+Wn)+ \\ fvth(DL=DL2)*W2/(W1+W2+\ldots+Wn)+\ldots+ \\ fvth(DL=DLn)*Wn/(W1+W2+\ldots+Wn) \quad (2).$$

19. A computer-readable software product for realizing a method of generating a transistor model, wherein said method comprises:
extracting a non-rectangular transistor region, in which a gate region is formed above a non-rectangular diffusion layer region, from a mask layout data of a semiconductor integrated circuit;
dividing said non-rectangular transistor region into a plurality of rectangular transistor regions by a division line extending in a direction of a gate length of a transistor;
relating said non-rectangular transistor region and said plurality of rectangular transistor regions with said mask layout data;
calculating a size data of each of said plurality of rectangular transistor regions;
calculating a correction value of a diffusion layer length dependency parameter to said plurality of rectangular transistor regions based on said size data; and
registering a transistor model of said transistor for a circuit simulation based on said diffusion layer length dependency parameter and said correction value.

* * * * *